(12) United States Patent
Fernandes et al.

(10) Patent No.: US 11,710,764 B2
(45) Date of Patent: Jul. 25, 2023

(54) IC WITH 3D METAL-INSULATOR-METAL CAPACITOR

(71) Applicant: Texas Instruments Incorporated, Dallas, TX (US)

(72) Inventors: Poornika Fernandes, Murphy, TX (US); Sagnik Dey, Frisco, TX (US); Luigi Colombo, Dallas, TX (US); Haowen Bu, Plano, TX (US); Scott Robert Summerfelt, Garland, TX (US); Mark Robert Visokay, Dallas, TX (US); John Paul Campbell, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1 day.

(21) Appl. No.: 16/020,131

(22) Filed: Jun. 27, 2018

(65) Prior Publication Data

US 2020/0006471 A1   Jan. 2, 2020

(51) Int. Cl.
*H01L 21/285* (2006.01)
*H01L 49/02* (2006.01)
*H01L 21/3213* (2006.01)
*H01L 21/306* (2006.01)

(52) U.S. Cl.
CPC ........ *H01L 28/91* (2013.01); *H01L 21/28518* (2013.01); *H01L 21/306* (2013.01); *H01L 21/32133* (2013.01)

(58) Field of Classification Search
CPC .................................................. H01L 21/285
See application file for complete search history.

(56) References Cited

U.S. PATENT DOCUMENTS

| | | | |
|---|---|---|---|
| 7,956,400 B2 | 6/2011 | Smith | |
| 2007/0296010 A1* | 12/2007 | Su | H01L 27/1087 257/301 |
| 2011/0115005 A1* | 5/2011 | Coolbaugh | H01L 28/60 257/296 |
| 2015/0295019 A1* | 10/2015 | Wang | H01L 23/585 257/532 |
| 2015/0295020 A1* | 10/2015 | Tseng | H01L 27/0805 257/532 |
| 2017/0025429 A1* | 1/2017 | Jen | H01L 27/0629 |

FOREIGN PATENT DOCUMENTS

WO   WO-2004100232 A1 * 11/2004 ......... H01L 27/0805

* cited by examiner

*Primary Examiner* — Marvin Payen
(74) *Attorney, Agent, or Firm* — Yudong Kim; Frank D. Cimino

(57) ABSTRACT

An integrated circuit (IC) including a semiconductor surface layer of a substrate including functional circuitry having circuit elements formed in the semiconductor surface layer configured together with a Metal-Insulator-Metal capacitor (MIM) capacitor on the semiconductor surface layer for realizing at least one circuit function. The MIM capacitor includes a multilevel bottom capacitor plate having an upper top surface, a lower top surface, and sidewall surfaces that connect the upper and lower top surfaces (e.g., a bottom plate layer on a three-dimensional (3D) layer or the bottom capacitor plate being a 3D bottom capacitor plate). At least one capacitor dielectric layer is on the bottom capacitor plate. A top capacitor plate is on the capacitor dielectric layer, and there are contacts through a pre-metal dielectric layer to contact the top capacitor plate and the bottom capacitor plate.

36 Claims, 18 Drawing Sheets

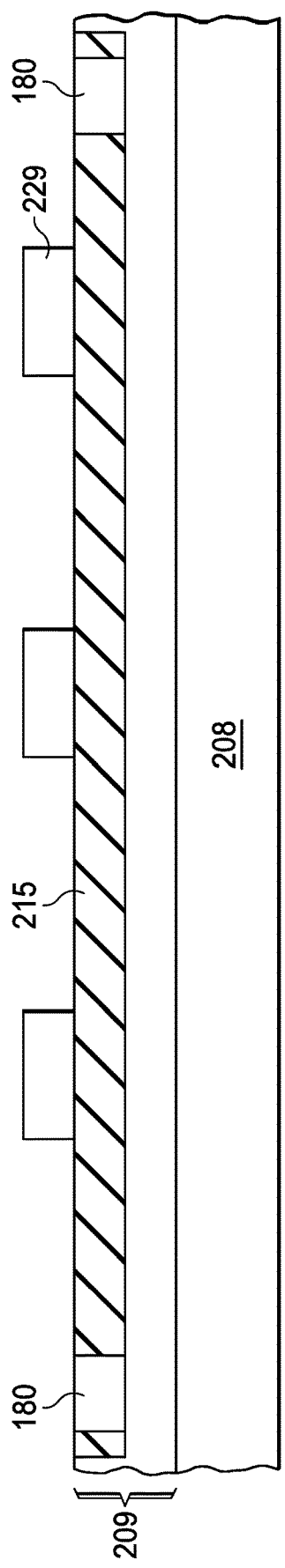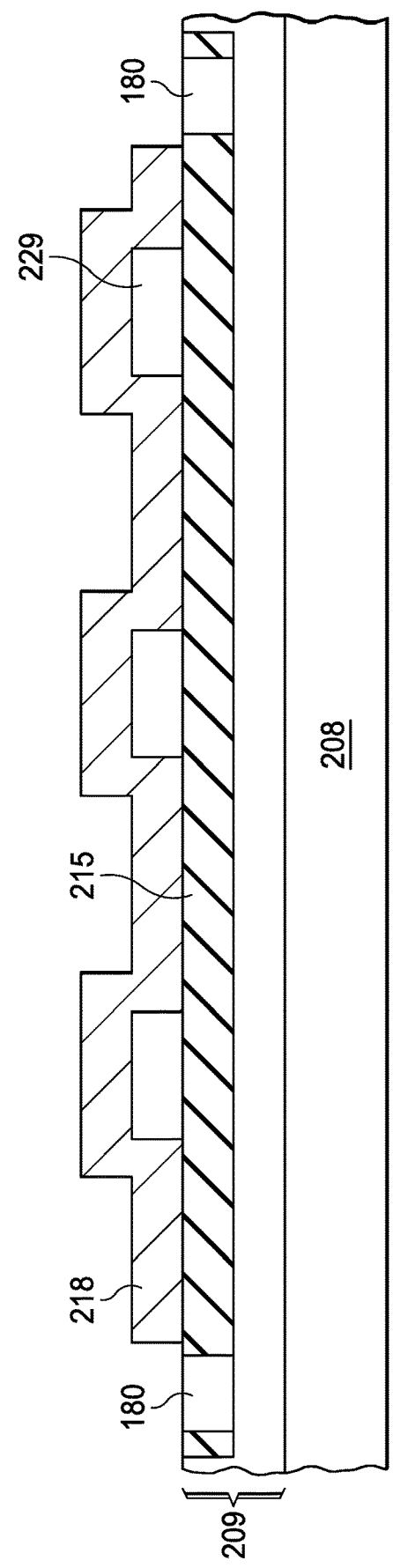

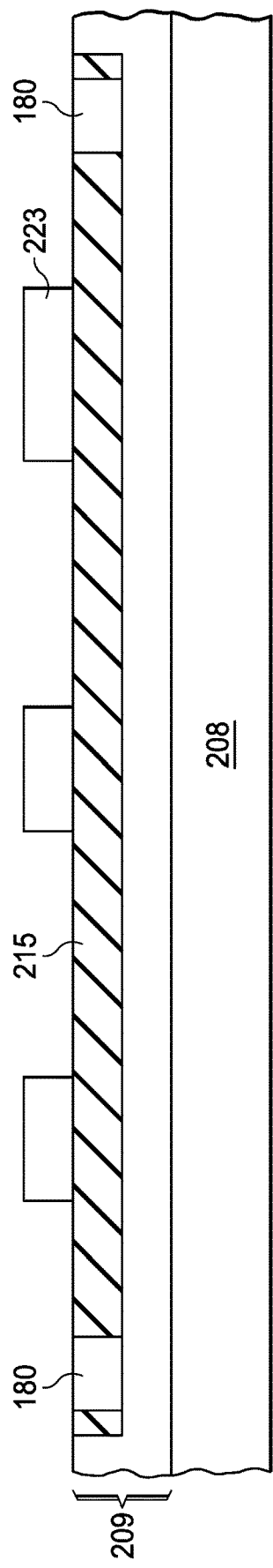
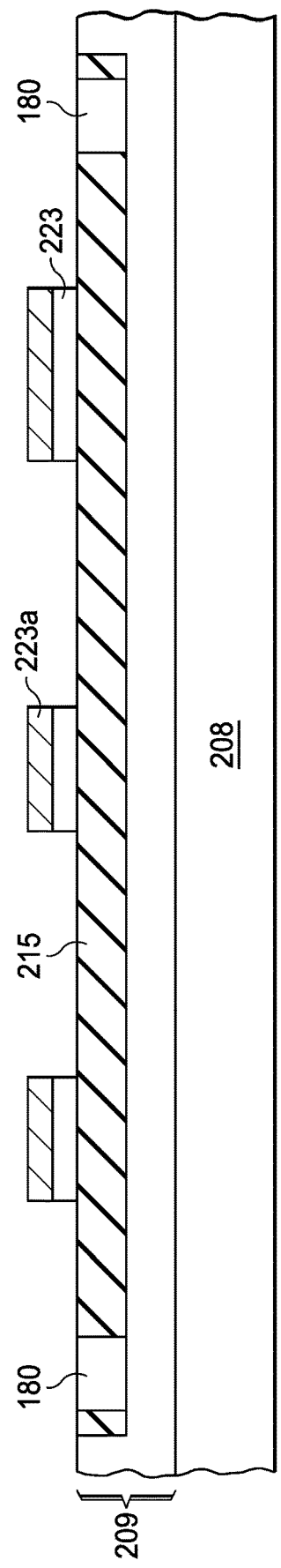
FIG. 4A
FIG. 4B

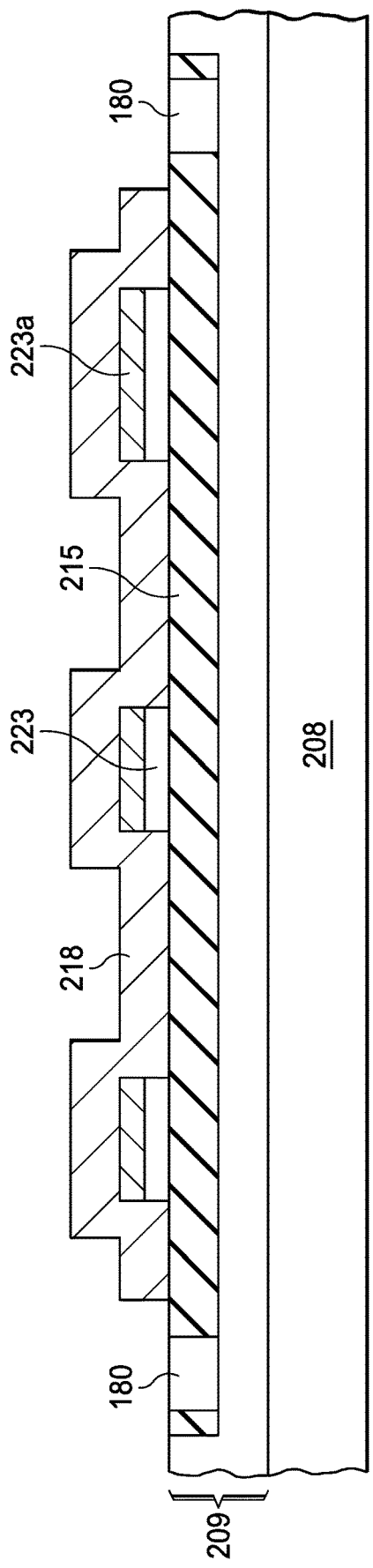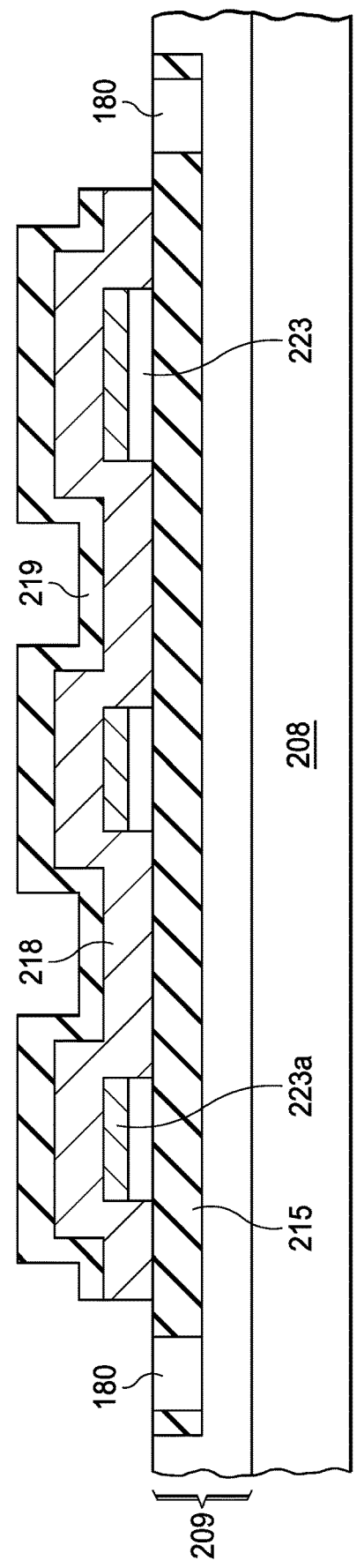

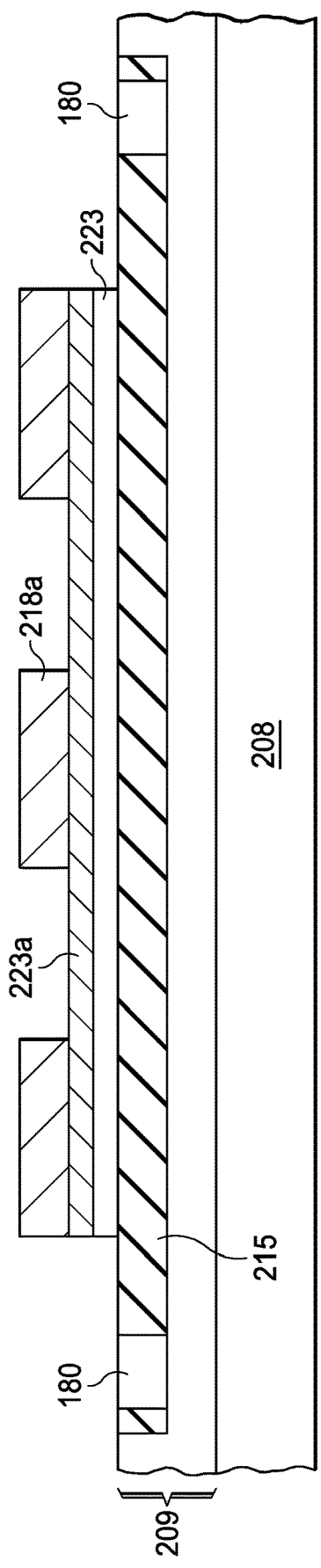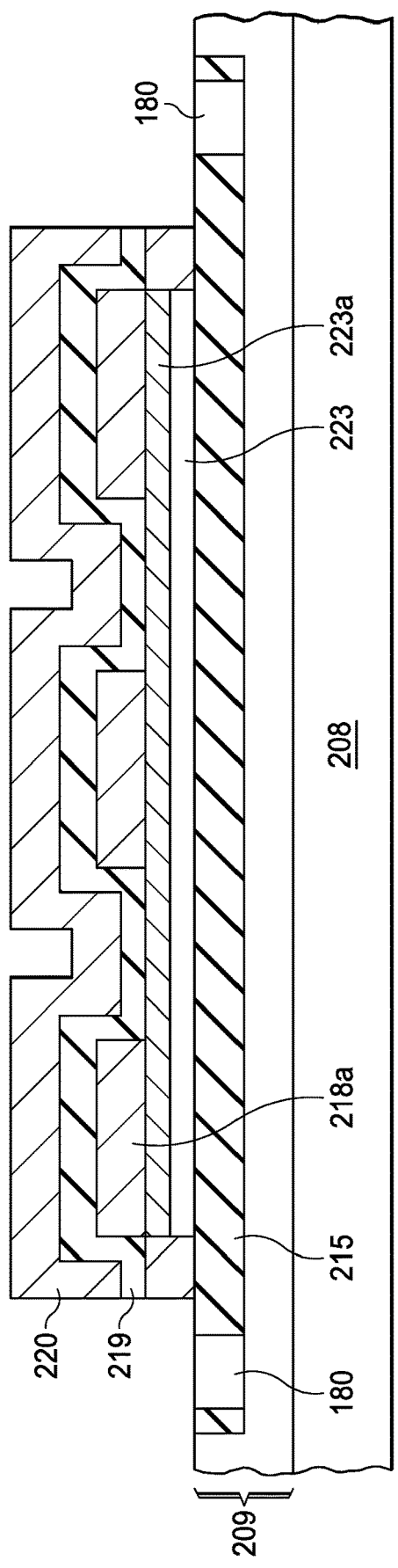
FIG. 5A
FIG. 5B

IC WITH 3D METAL-INSULATOR-METAL CAPACITOR

FIELD

This Disclosure relates integrated circuit (IC) devices having Metal-Insulator-Metal capacitors.

BACKGROUND

A Metal-Insulator-Metal (MIM) capacitor is generally considered to be an important passive component in IC devices including Radio Frequency (RF) and analog ICs. MIM capacitors have attracted attention because of their high capacitance density that provides a relatively small chip area which increases circuit density, and further reduces the IC fabrication cost.

For example, advanced analog circuit applications may need precision capacitors which have voltage linearity of less than ±1 part per million (ppm) and a capacitance density larger than 1 fF/μm$^2$. The typical capacitance-voltage (CV) relationship of precision capacitors can be analytically expressed in terms of two voltage coefficients, linear (β) and quadratic (α). For materials used in current state-of-art precision capacitors these coefficients that determine the voltage linearity, one may assume a value for β ranging from ±1 to ±20, and a value for α ranging between ±3 to ±4. While the absolute value of the voltage coefficients that are even lower than the ones quoted above can be achieved, this results in much lower capacitance densities. However, as device dimensions scale to meet market trends it is important that capacitance densities increase to enable the reduction of semiconductor chip area. Conventional MIM caps have a parallel plate planar structure.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include an IC including a semiconductor surface layer of a substrate including functional circuitry having a disclosed three-dimensional (3D) Metal-Insulator-Metal (MIM) capacitor on the semiconductor surface layer. The 3D MIM capacitor includes a multilevel bottom capacitor plate having bottom capacitor plate layer on a 3D layer or the bottom capacitor plate itself is a 3D layer. At least one capacitor dielectric layer is on the bottom capacitor plate. A top capacitor plate is on the capacitor dielectric layer, and there are contacts through a pre-metal dielectric layer to contact the top capacitor plate and the bottom capacitor plate.

BRIEF DESCRIPTION OF THE DRAWINGS

Reference will now be made to the accompanying drawings, which are not necessarily drawn to scale, wherein:

FIGS. 3A-D show successive cross sectional depictions for a second flow option for forming an example 3D MIM capacitor on an IC that utilizes a silicide block (Siblk) step for the 3D features, according to an example aspect.

FIGS. 4A-G show successive cross sectional depictions for a third flow option for forming an example 3D MIM capacitor on an IC that utilizes a polysilicon step for the 3D features, according to an example aspect.

FIGS. 5A-E show successive cross sectional depictions for a fourth flow option for forming an example 3D MIM capacitor on an IC that utilizes a patterned layer on polysilicon for the 3D features, according to an example aspect.

DETAILED DESCRIPTION

Figure 1:
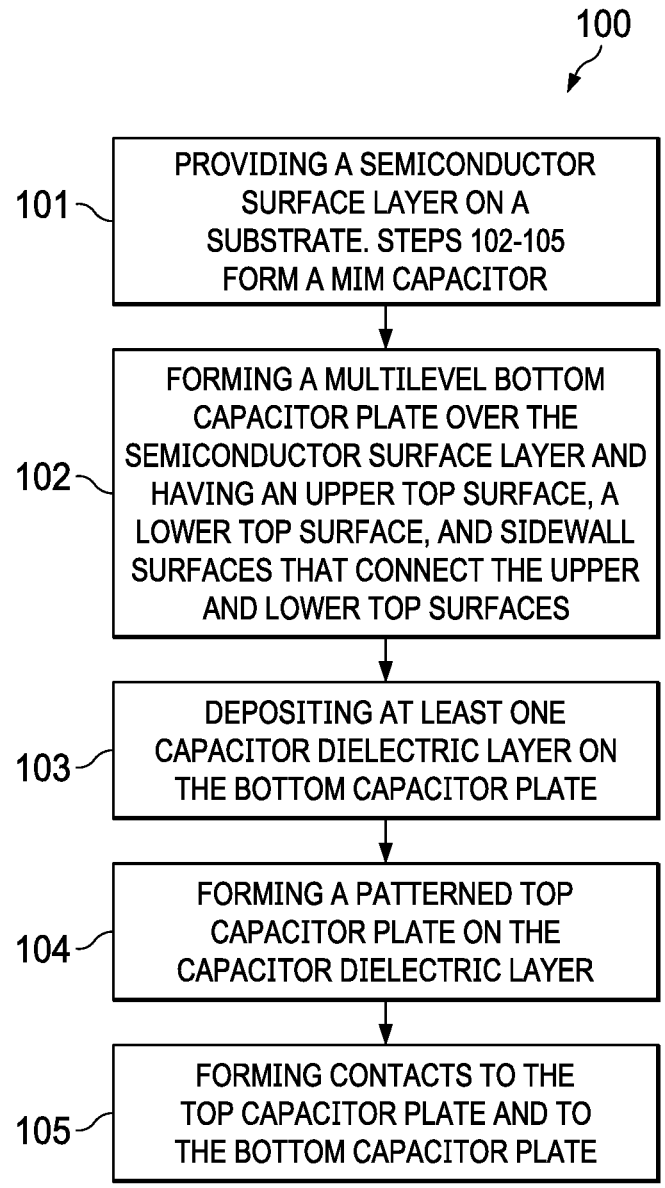
FIG. 1 is a flow chart that shows steps in an example method of fabricating ICs including at least one 3D MIM capacitor, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize for saving chip area, it is desirable to provide an IC with a 3D arrangement of MIM capacitor(s) which provides a higher capacitance (C) per unit area (C/A) beyond the C/A provided by a conventional planar MIM capacitor structure. As described above, the bottom capacitor plate of the 3D MIM capacitor is a multilevel bottom capacitor plate that is on a 3D layer or the bottom capacitor plate is itself is formed as a 3D layer. As used herein, a disclosed multilevel bottom capacitor plate has a plurality of different levels or elevations (e.g., in the form a square wave structure) comprising the bottom capacitor plate on at least one 3D layer or a bottom capacitor plate layer itself is formed as a 3D layer, which may be contrasted with a conventional parallel plate capacitor that has a single level (or elevation) over its full area. As such, the bottom capacitor plate has an upper top surface, a lower top surface, and sidewall surfaces that connect the upper and lower top surfaces. The 3D MIM capacitor structure can be formed on field oxidation such as shallow trench isolation (STI) or LOCal Oxidation of Silicon (LOCOS).

FIG. 1 is a flow chart that shows steps in an example method 100 of fabricating ICs including at least one 3D MIM capacitor. As used herein metal plates of the MIM capacitor besides comprising a metal or a metal alloy can also include non-metal atoms, such as N (TaN or TiN) or Si. For example, the bottom capacitor plate can comprise TaN, TiN, Ni, Pt, Co, CoSi, or Ir, and the top capacitor plate can comprise TaN, TiN, Ni, Pt, Co, CoSi, or Ir.

Step 101 comprises providing a semiconductor surface layer 209 on a substrate 208 including functional circuitry 180 comprising circuit elements formed in the semiconductor surface layer configured together with the MIM capacitor(s) for realizing at least one circuit function. Plates of the MIM capacitor are generally coupled to nodes in the functional circuitry 180. However, it is also possible for plates of the MIM capacitor to be provided as separate pins of an IC. Example circuit functions include analog (e.g., amplifier or power converter), radio frequency (RF), digital, or non-volatile memory functions. The substrate 208 and/or semiconductor surface 209 can comprise silicon, silicon-germanium, or another semiconductor material.

The capability of functional circuitry provided on a disclosed IC may vary, for example ranging from a simple device to a complex device. The specific functionality contained within functional circuitry is not of importance to disclosed ICs. The functional circuitry is generally formed in the substrate before forming the MIM cap(s).

Steps 102-105 described below form the 3D MIM capacitor on a dielectric layer that is on the semiconductor surface layer 209. The multilevel bottom capacitor plate of the MIM capacitor is described in FIGS. 2A-D, 3A-D, 4A-G, 5A-E, and 6A-E as being under the metal 1 (M1) layer, so that M1 is shown contacting the top capacitor plate and the bottom capacitor plate. For this arrangement, such as for a polysilicon bottom plate with a TiN or TaN top plate capacitor, the top and bottom capacitor plate are both contacted by M1. However, provided the bottom plate contact does not comprise polysilicon, disclosed MIM caps can also be moved up in the stack to be a back end of the line (BEOL) capacitor. For example, as a TiN bottom plate and a M1 (top plate capacitor, such as in an aluminum metal BEOL process. In those cases, the MIM cap would be contacted by a metal level above M1, generally by metal 2 (M2), or a metal layer above M2.

Step 102 comprises forming a multilevel bottom capacitor plate over the semiconductor surface layer generally on a field dielectric layer that is partially in semiconductor surface layer 209 (e.g., LOCOS) or dielectric fully in (e.g., STI) the semiconductor surface layer 209 comprising a bottom capacitor plate layer on at least one 3D layer or the bottom capacitor plate itself is a 3D bottom capacitor plate layer. In either case, the bottom capacitor plate includes multiple levels including an upper top surface, a lower top surface, and sidewall surfaces that connect the upper and lower top surfaces. Step 103 comprises depositing at least one capacitor dielectric layer on the bottom capacitor plate including both the upper and lower top surfaces. The capacitor dielectric layer can comprise a dielectric stack with 2 or more dielectric layers. The capacitor dielectric layer(s) can comprise a high-k dielectric layer defined herein having a k-value of at least that of silicon nitride (k>7) so that its k-value is above that of silicon oxide (k-value of 3.9), silicon oxide-nitride-silicon oxide (ONO), NON, oxide, nitride with refers to herein to silicon nitride or SiON, or a multi-layer dielectric stack (e.g., ONON, or ONONO). One capacitor dielectric stack comprises ONO. The total thickness of the capacitor dielectric layer(s) is generally in a range from 200 Å to 2,000 Å.

The nitride layer (e.g., silicon nitride or a silicon oxynitride) in the capacitor dielectric stack has a hydrogen concentration of ≤18 atomic %. This hydrogen concentration in the nitride layer is lower as compared to the hydrogen concentration in a conventional silicon nitride or silicon oxynitride layer that is generally 20 to 30 atomic %. It is recognized herein that a relatively low hydrogen content in the nitride layer in a capacitor dielectric stack provides improved voltage linearity for the MIM capacitor including a low $|\beta|$ value and a low $|(\alpha)|$ value.

The deposition process to obtain a low hydrogen concentration nitride layer can comprise chemical vapor deposition (CVD) such as low pressure CVD (LPCVD) or plasma enhanced CVD (PECVD), where the gases used include a nitrogen source comprising at least one nitrogen compound other than $N_2$ as well as $N_2$, and where a mass flow of the $N_2$ is at least 51% of a mass flow of the nitrogen source. For one particular example, PECVD silicon nitride may be deposited at a deposition temperature range of 300° C. to 500° C. with an $N_2$ mass flow rate in a range of 3,000 sccm to 10,000 sccm, a $NH_3$ mass flow rate of 200 to 1,000 sccm, a $SiH_4$ mass flow rate of 20 to 200 sccm, at a pressure of 2 to 6 Torr while applying RF-low frequency (LF) power and RF-high frequency (HF) power. The RF-LF power can be in a frequency range of 50 kHz to about 500 kHz, for example, 400 kHz in a power range of 10 W to 200 W, and the RF-HF power can be in a frequency range of 10 MHz or more, for example, 13.65 MHz in a power range of 50 W to 400 W.

Step 104 comprises forming a patterned top capacitor plate on the capacitor dielectric layer. The top capacitor plate extends over both the upper and lower top surfaces of the capacitor bottom plate and thus the top capacitor plate also includes an upper top surface, a lower top surface, and sidewall surfaces that connect the upper and lower top surfaces. Step 104 generally comprises deposition, patterning, and then etching. Step 105 comprises forming contacts to the top capacitor plate and to the bottom capacitor plate. The wafer processing can then then be completed by conventional BEOL processing comprising forming one or more additional metal levels thereon including a top metal level. The top metal layer can comprise aluminum (or an aluminum alloy) or copper. Passivation overcoat (PO) then generally follows, followed by patterning the PO to expose the bond pads. The PO layer comprises at least one dielectric layer such as silicon oxide, silicon nitride, or SiON.

The 3D topography enabled by the integration schemes described above for disclosed 3D MIM capacitors can achieve capacitor densities as high as 20× larger than what can be achieved by conventional planar MIM capacitors. The higher the aspect ratio (AR), the higher the capacitance provided. Disclosed 3D MIM caps generally provide a capacitance/area (C/A) value of >1.5 fF/µm², such as a C/A value in the range of 1.5 fF/µm² to 20 fF/µm².

Figure 2A:
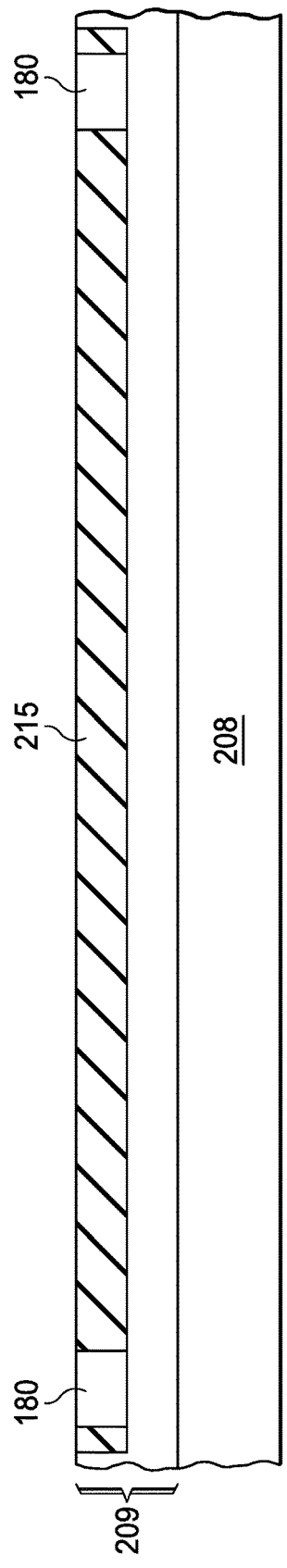
FIGS. 2A-D show successive cross sectional depictions for a first flow option for forming an example 3D MIM capacitor on an IC that utilizes an oxide step for the 3D features, according to an example aspect.

FIGS. 2A-D show successive cross sectional depictions for a first flow option for forming an example 3D MIM capacitor on an IC that utilizes an oxide step for a 3D layer including a plurality of 3D features, according to an example aspect. FIG. 2A corresponds to the structure provided in step 101 being a semiconductor surface layer 209 on a substrate 208 including functional circuitry 180 shown simply as a block, with field oxide 215 shown as STI shown in the semiconductor surface layer 209 with its characteristic planarity on a portion of the semiconductor surface layer 209. The functional circuitry 180 comprises circuit elements (including transistors, and generally diodes, resistors, capacitors, etc.) formed in the semiconductor surface layer 209 configured together with MIM capacitor(s) for realizing at least one circuit function. Example circuit functions include analog (e.g., amplifier or power converter), radio frequency (RF), digital, or non-volatile memory functions.

Figure 2B:
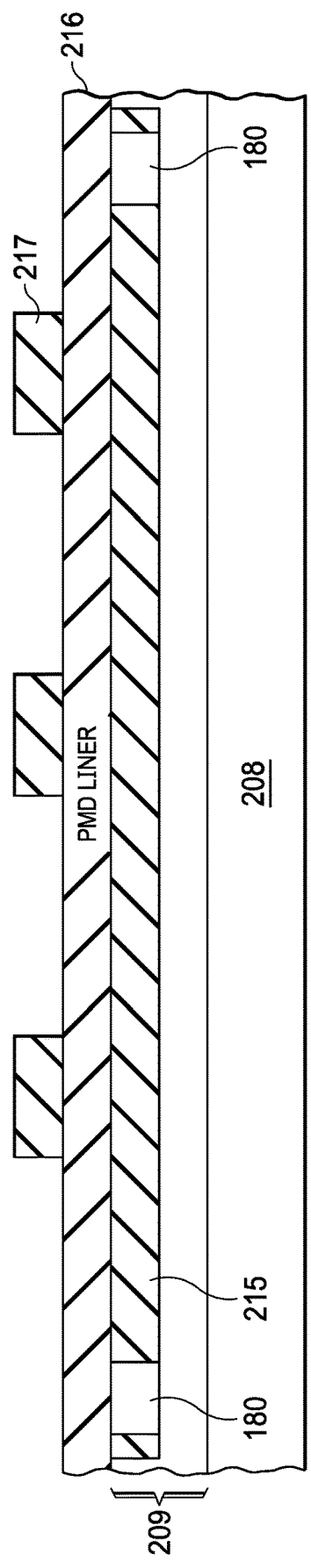
Figure 2C:
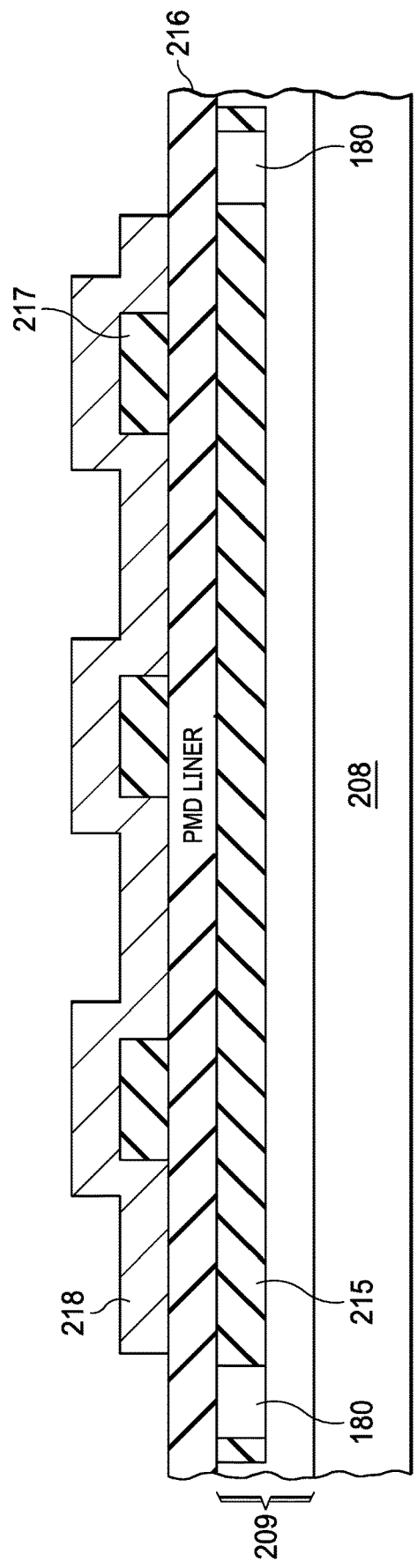

FIG. 2B shows the in-process IC after depositing a pre-metal dielectric (PMD) liner layer 216 such as silicon nitride, another dielectric layer 217 such as silicon oxide on top the PMD liner, followed by patterning and then etching the dielectric layer 217 which provides the oxide step for the 3D features of the multilevel MIM capacitor. The thickness of the other dielectric layer 217 is generally 500 A to 5,000 A. FIG. 2C shows the in-process IC after depositing a bottom capacitor plate layer 218 and then patterning the bottom capacitor plate layer. Because the bottom capacitor plate layer 218 is on 3D features provided by blocks of the dielectric layer 217, the bottom capacitor plate layer 218 can be seen to have a square wave form having an upper top surface (when over the blocks), a lower top surface (when not over the blocks), and sidewall surfaces that connect the upper and lower top surfaces.

Figure 2D:
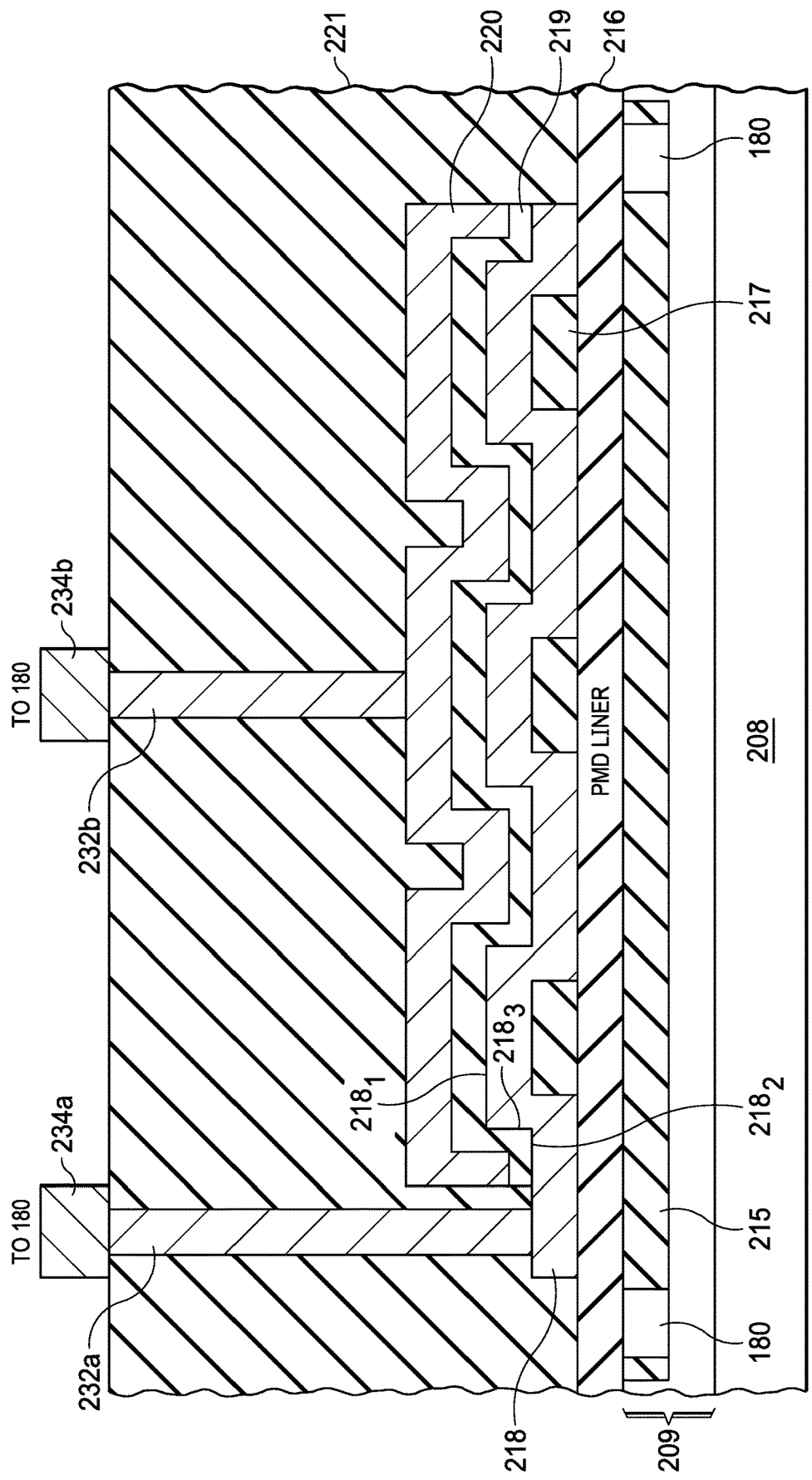

The bottom capacitor plate layer can comprise TaN or TiN. FIG. 2D shows the in-process IC after depositing at least one capacitor dielectric layer 219, forming a patterned top capacitor plate 220, forming a PMD layer 221, forming and then filling contacts in the PMD layer shown as filled contacts 232a and 232b (e.g., using W) to contact the bottom capacitor plate layer 218 and the top capacitor plate 220, respectively, and then forming metal contact 234a over filled contact 232a and metal contact 234b over filled contact 232b, such a AlCu, on the PMD layer 221 over the filled contacts 232a and 232b. Over the metal contacts 234a and 234b is shown "to 180" that indicates their being connected to respective nodes within the functional circuitry 180. As shown, the bottom capacitor plate layer 218, capacitor dielectric layer 219 and top capacitor plate 220 each include an upper top surface, a lower top surface, and sidewall surfaces that connect the upper and lower top surfaces. The upper top surface, a lower top surface, and sidewall surfaces of the bottom capacitor plate layer 218 are shown as $218_1$, $218_2$, and $218_3$, respectively.

Figure 3C:
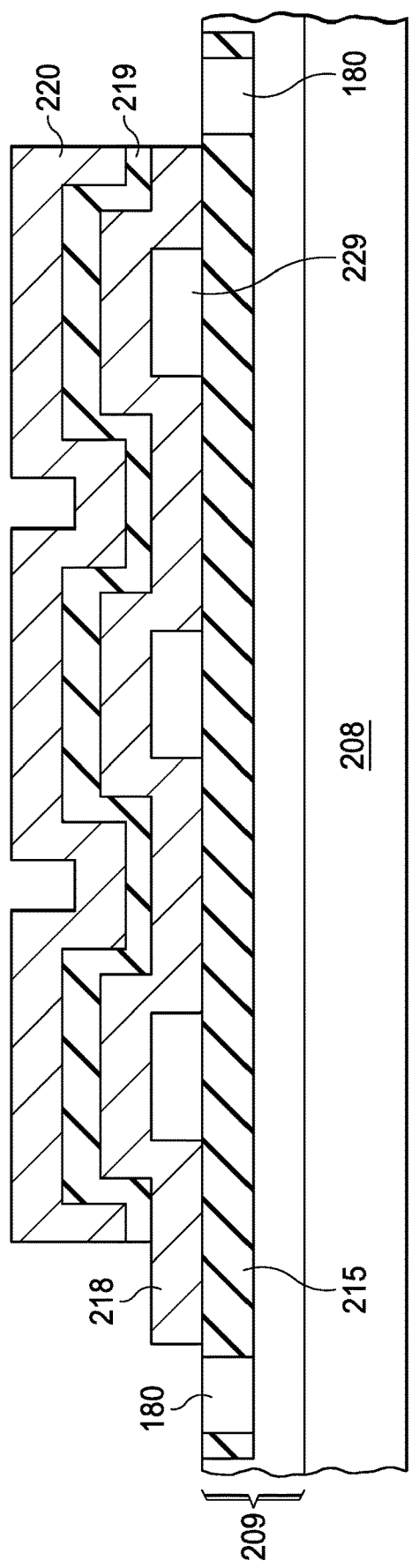

FIGS. 3A-D show successive cross sectional depictions for a second flow option for forming an example 3D MIM capacitor on an IC that utilizes a Siblk layer step for the 3D features, according to an example aspect. A Siblk layer can comprise a deposited oxide, nitride, oxynitride layer, or multiple layers in combination. FIG. 3A shows the in-process IC after depositing and patterning a Siblk layer 229 on a field oxide layer 215 of the in-process IC shown in FIG. 2A. FIG. 3B shows the in-process IC after depositing a bottom capacitor plate layer 218 and then patterning the bottom capacitor plate layer 218. The bottom capacitor plate layer 218 can comprise TaN or TiN. FIG. 3C shows the in-process IC after depositing at least one capacitor dielectric layer 219, and then forming a pattern then etching a top capacitor plate 220.

Figure 3D:
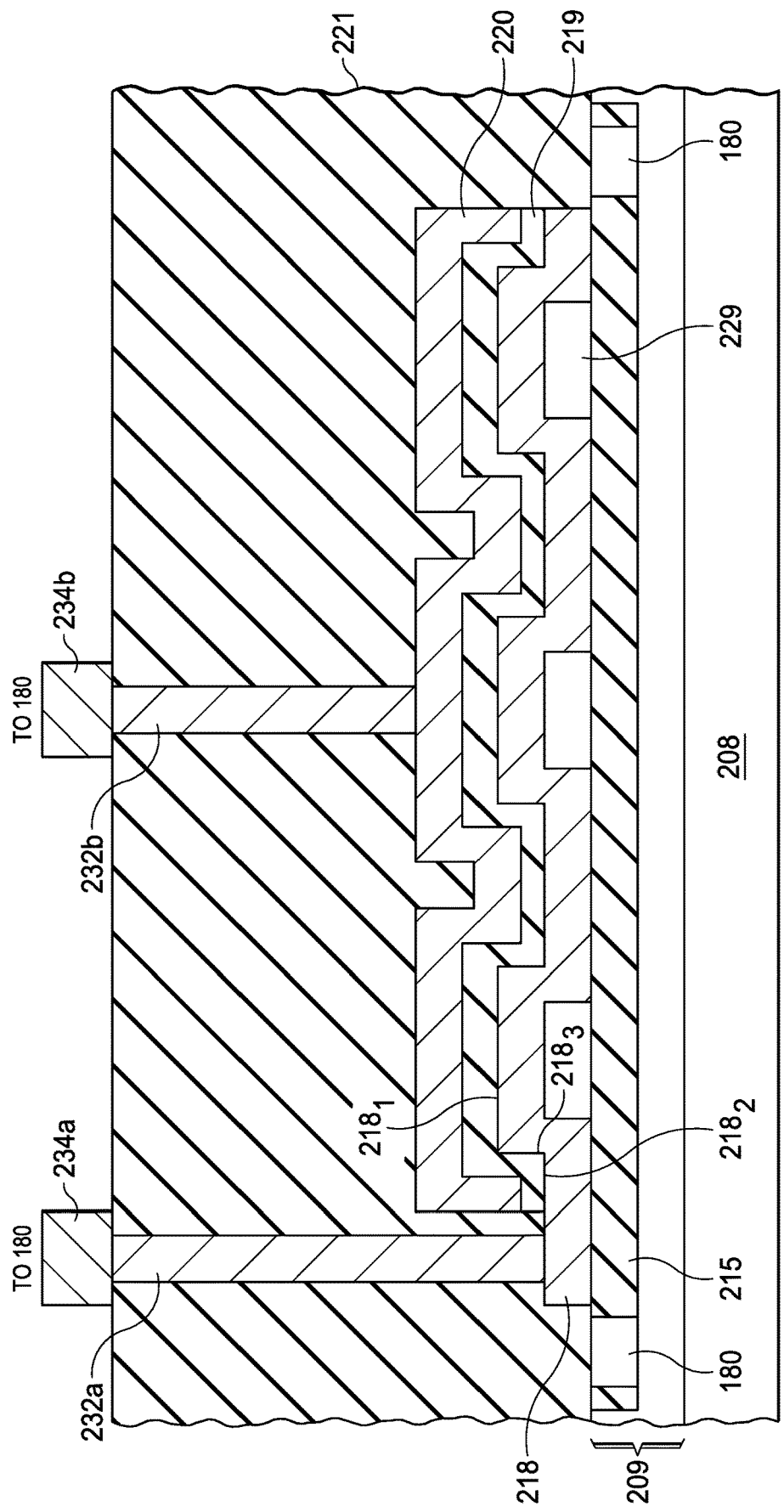

FIG. 3D shows the in-process IC after forming a PMD layer 221, forming and then filling contacts in the PMD layer shown as filled contacts 232a and 232b to contact the bottom capacitor plate layer 218 and the top capacitor plate 220, respectively, and then forming metal contacts 234a, 234b on the PMD layer 221 over the filled contacts 232a and 232b. Although not shown, the M1 can be in a damascene structure, such as for copper M1. As shown, the bottom capacitor plate layer 218, capacitor dielectric layer 219 and top capacitor plate 220 each include an upper top surface, a lower top surface, and sidewall surfaces that connect the upper and lower top surfaces. The upper top surface, a lower top surface, and sidewall surfaces of the bottom capacitor plate layer 218 are shown as $218_1$, $218_2$, and $218_3$, respectively.

Figure 4E:
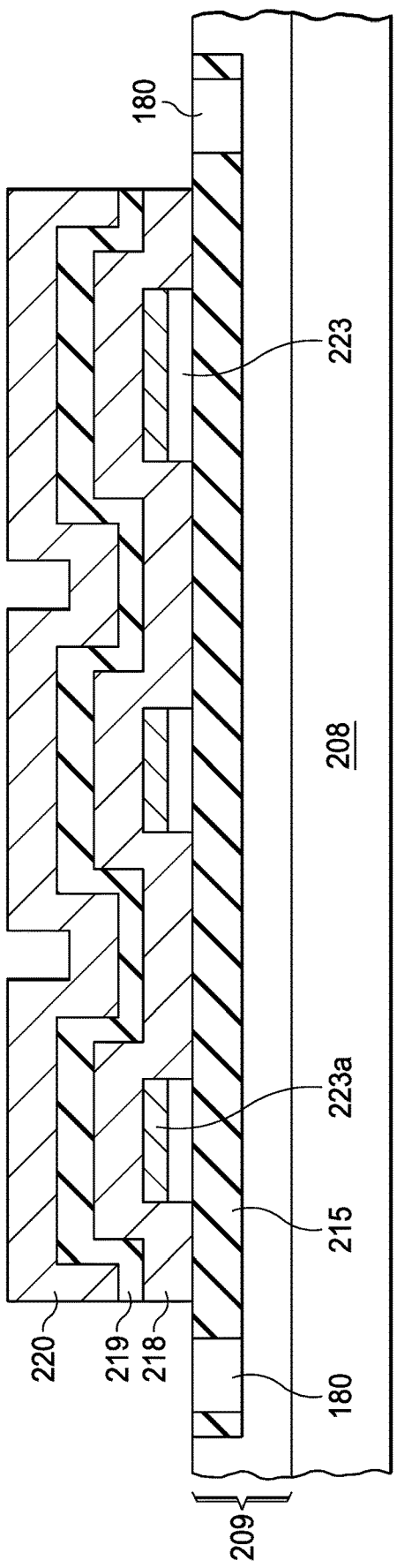

FIGS. 4A-G show successive cross sectional depictions for a third flow option for forming an example 3D MIM capacitor on an IC that utilizes a polysilicon step for the 3D features, according to an example aspect. FIG. 4A shows the in-process IC after depositing and patterning a polysilicon layer 223 on the field oxide layer 215 of the in-process IC shown in FIG. 2A. FIG. 4B shows the in-process IC after siliciding a top surface of the polysilicon layer 223 for forming a silicide layer 223a (e.g., CoSi) on the patterned polysilicon layer 223. FIG. 4C shows the in-process IC after depositing a bottom capacitor plate layer 218. The bottom capacitor plate layer can comprise TaN or TiN.

Figure 4F:
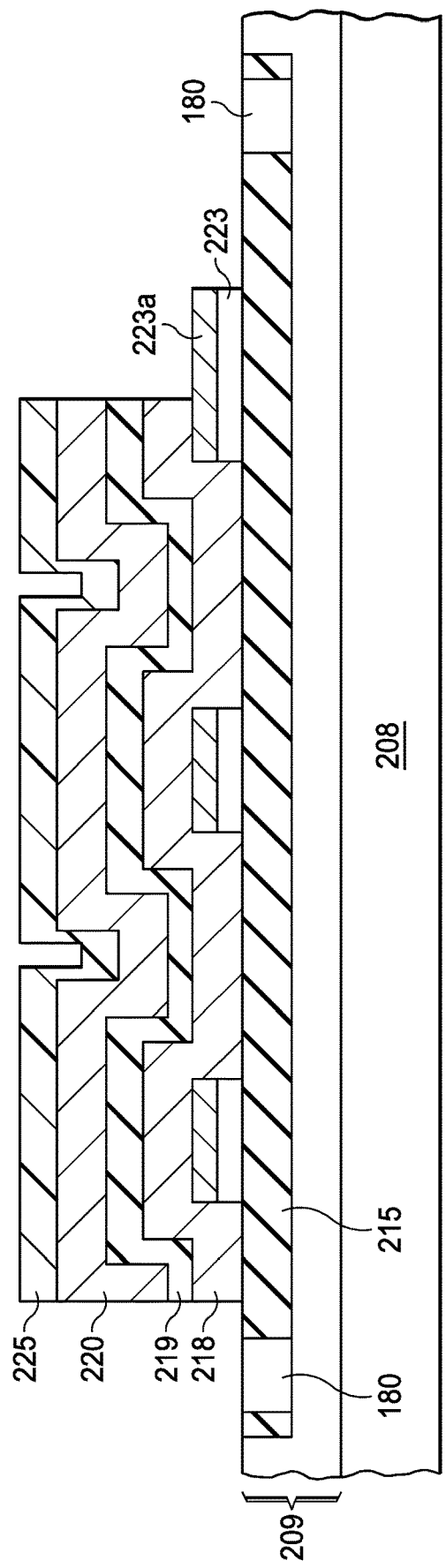
Figure 4G:
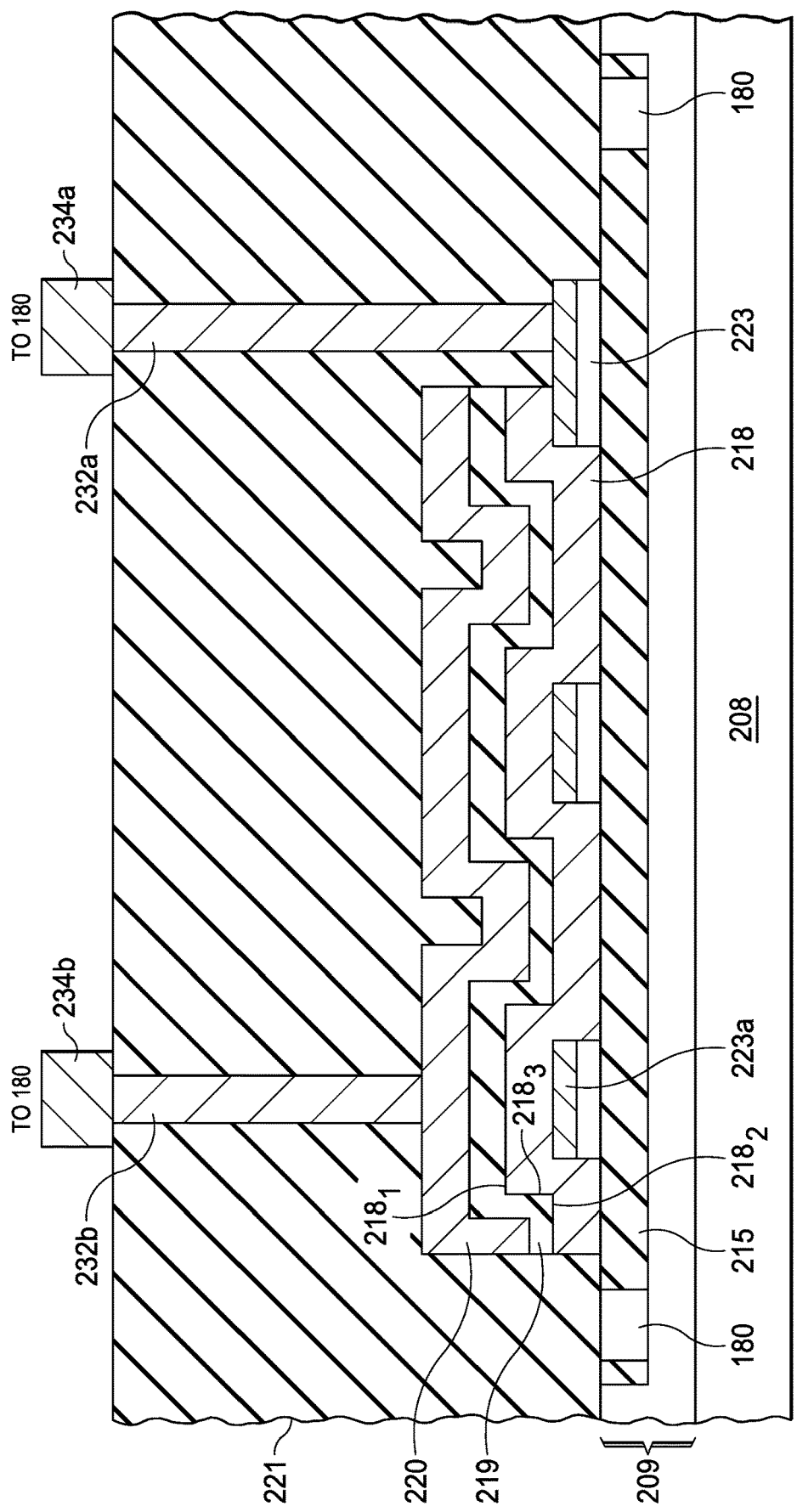

FIG. 4D shows the in-process IC after depositing at least one capacitor dielectric layer 219. FIG. 4E shows the in-process IC after depositing a top capacitor plate 220 on the capacitor dielectric layer 219. FIG. 4F shows the in-process IC after depositing a hard mask layer 225 such as comprising silicon nitride or oxynitride, and then etching the top capacitor plate 220, the capacitor dielectric layer 219, and the bottom capacitor plate layer 218. The etching of these 3 layers uses the same pattern, but generally uses different chemistries and different etch parameters for etching each of these layers. FIG. 4G shows the in-process IC after optionally removing the hard mask layer 225, forming a PMD layer 221, forming and then filling contacts in the PMD layer 221 shown as filled contacts 232a and 232b to contact the bottom capacitor plate layer 218 and the top capacitor plate 220, respectively, and then forming metal contacts 234a, 234b on the PMD layer 221 over the filled contacts 232a and 232b. As shown, the bottom capacitor plate layer 218, capacitor dielectric layer 219 and top capacitor plate 220 each include an upper top surface, a lower top surface, and sidewall surfaces that connect the upper and lower top surfaces. The upper top surface, a lower top surface, and sidewall surfaces of the bottom capacitor plate layer 218 are shown as $218_1$, $218_2$, and $218_3$, respectively.

Figure 5C:
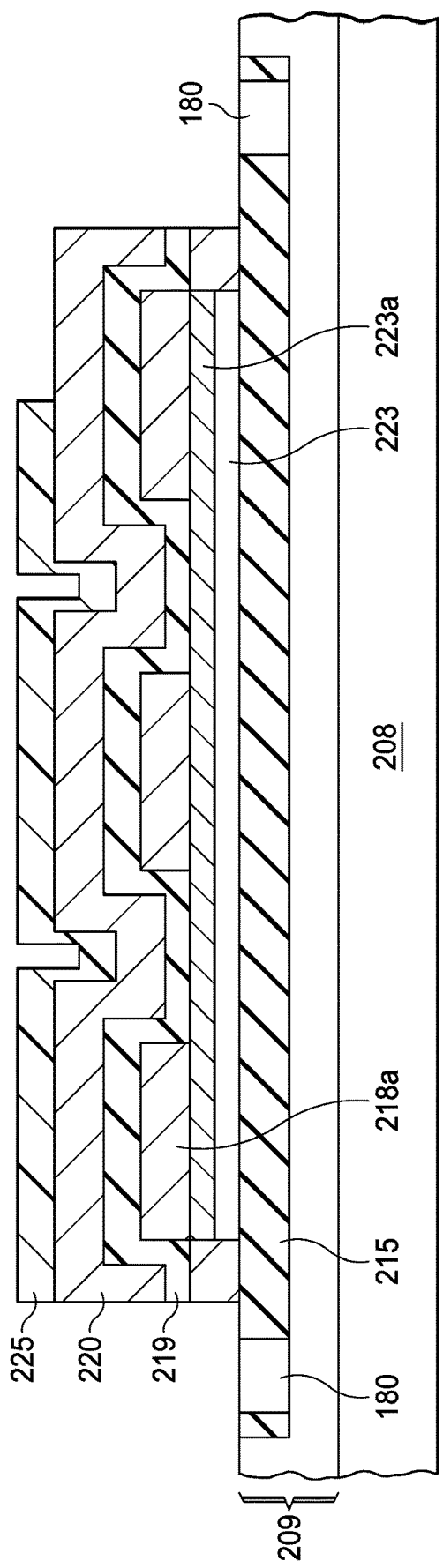

FIGS. 5A-F show successive cross sectional depictions for a fourth flow option for forming an example 3D MIM capacitor on an IC that utilizes a patterned conductive layer such as a TaN or TiN layer on a polysilicon layer for the 3D features, according to an example aspect. FIG. 5A shows the in-process IC shown in FIG. 2A after depositing, patterning and etching a patterned layer shown as 218a as it is a part of the lower capacitor plate on a silicide layer 223a that is on a patterned polysilicon layer 223 formed before that provides the other part of the lower capacitor plate. Layers 218a, 223a, and 223 form the multilevel bottom capacitor plate having an upper top surface (top surface of 218a), a lower top surface (surface of 223a not covered by 218a), and sidewall surfaces (sidewalls of 218a) that connect the upper and lower top surfaces. FIG. 5B shows the in-process IC after depositing a capacitor dielectric layer 219 and then depositing a top capacitor plate 220. FIG. 5C shows the in-process IC after depositing, patterning and etching a hard mask layer 225 on the top capacitor plate 220.

Figure 5D:
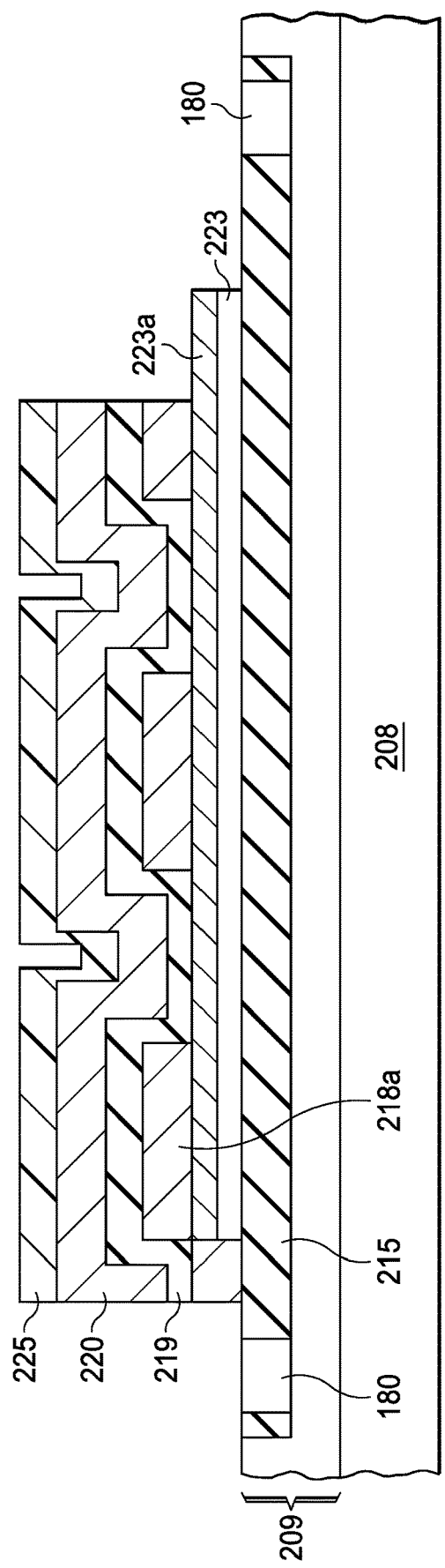
Figure 5E:
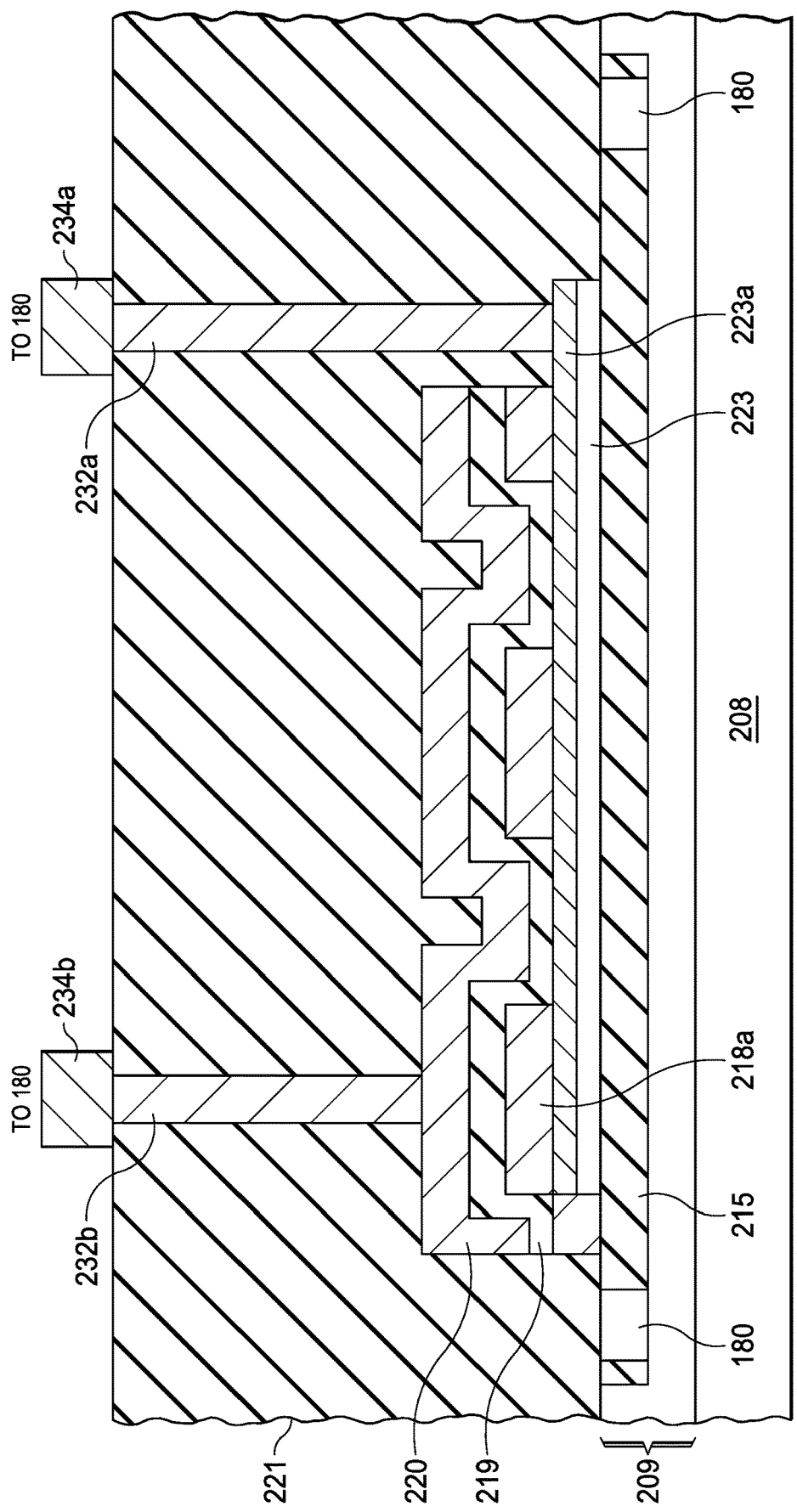

FIG. 5D shows the in-process IC after etching the top capacitor plate 220, the capacitor dielectric layer 219, and the bottom capacitor plate layer 218. FIG. 5E shows the in-process IC after optionally removing the hard mask layer 225, forming a PMD layer 221, forming and then filling contacts in the PMD layer 221 shown as filled contacts 232a and 232b to contact the bottom capacitor plate layer 218 and the top capacitor plate 220, respectively, and then forming metal contacts 234a, 234b on the PMD layer 221 over the filled contacts 232a and 232b.

Figure 6A:
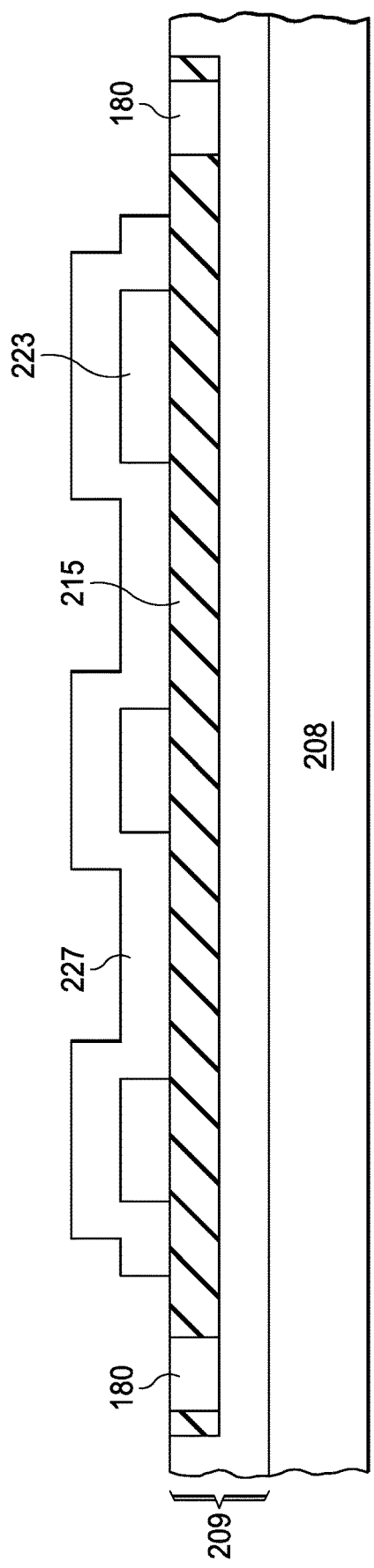
FIGS. 6A-E show successive cross sectional depictions for a fifth flow option for forming an example 3D MIM capacitor on an IC that utilizes a Siblk layer on polysilicon as a step for the 3D features, according to an example aspect.
Figure 6B:
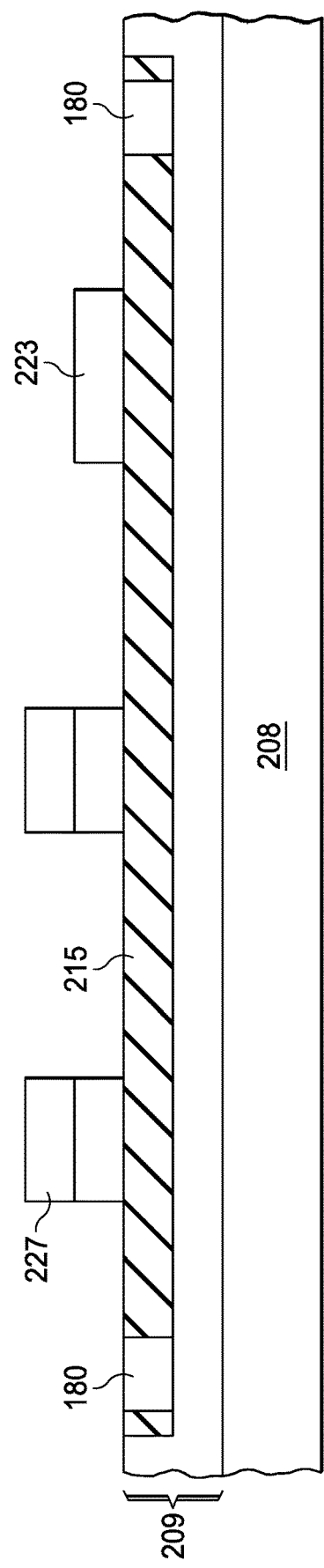

FIGS. 6A-E show successive cross sectional depictions for a fifth flow option for forming an example 3D MIM capacitor on an IC that utilizes a Siblk layer on polysilicon for a step for the 3D features, according to an example aspect. FIG. 6A shows the in-process IC after depositing and patterning a polysilicon layer 223 on the in-process IC shown in FIG. 2A, and then depositing a Siblk layer 227 on the patterned polysilicon layer 223. FIG. 6B shows the in-process IC after patterning the Siblk layer 227.

Figure 6C:
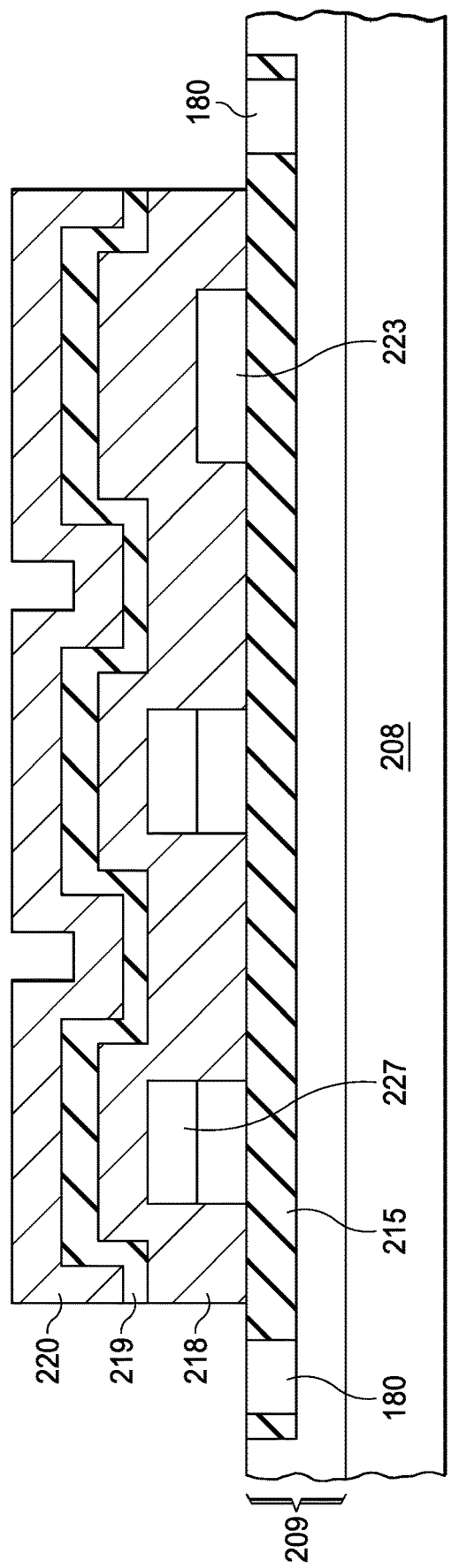
Figure 6D:
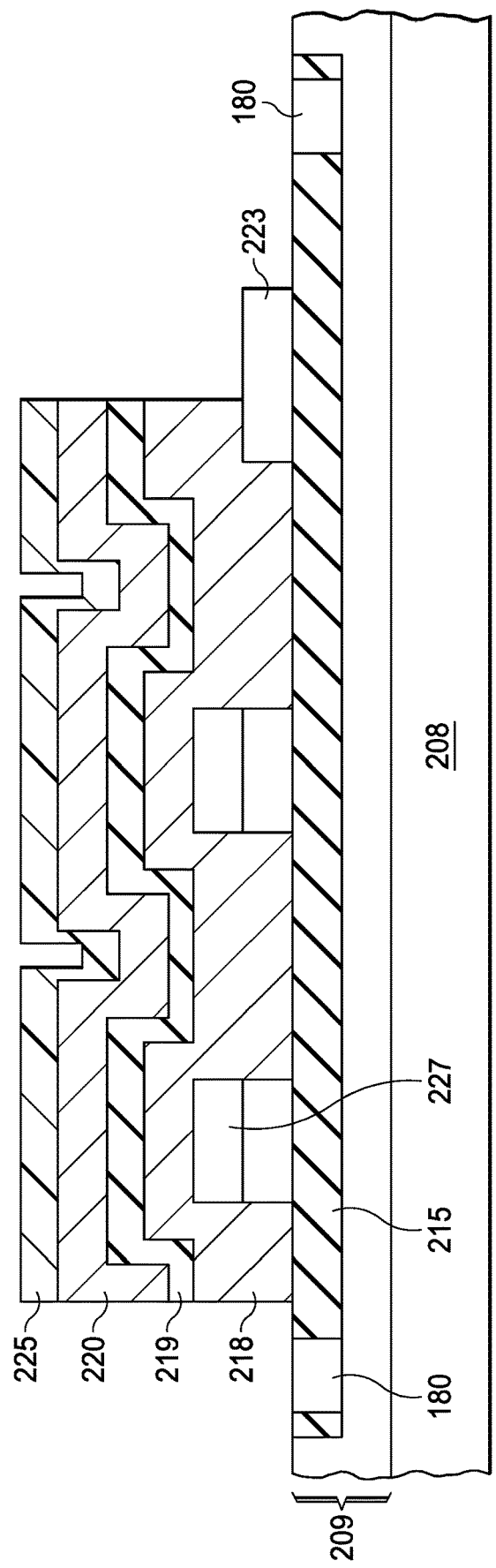
Figure 6E:
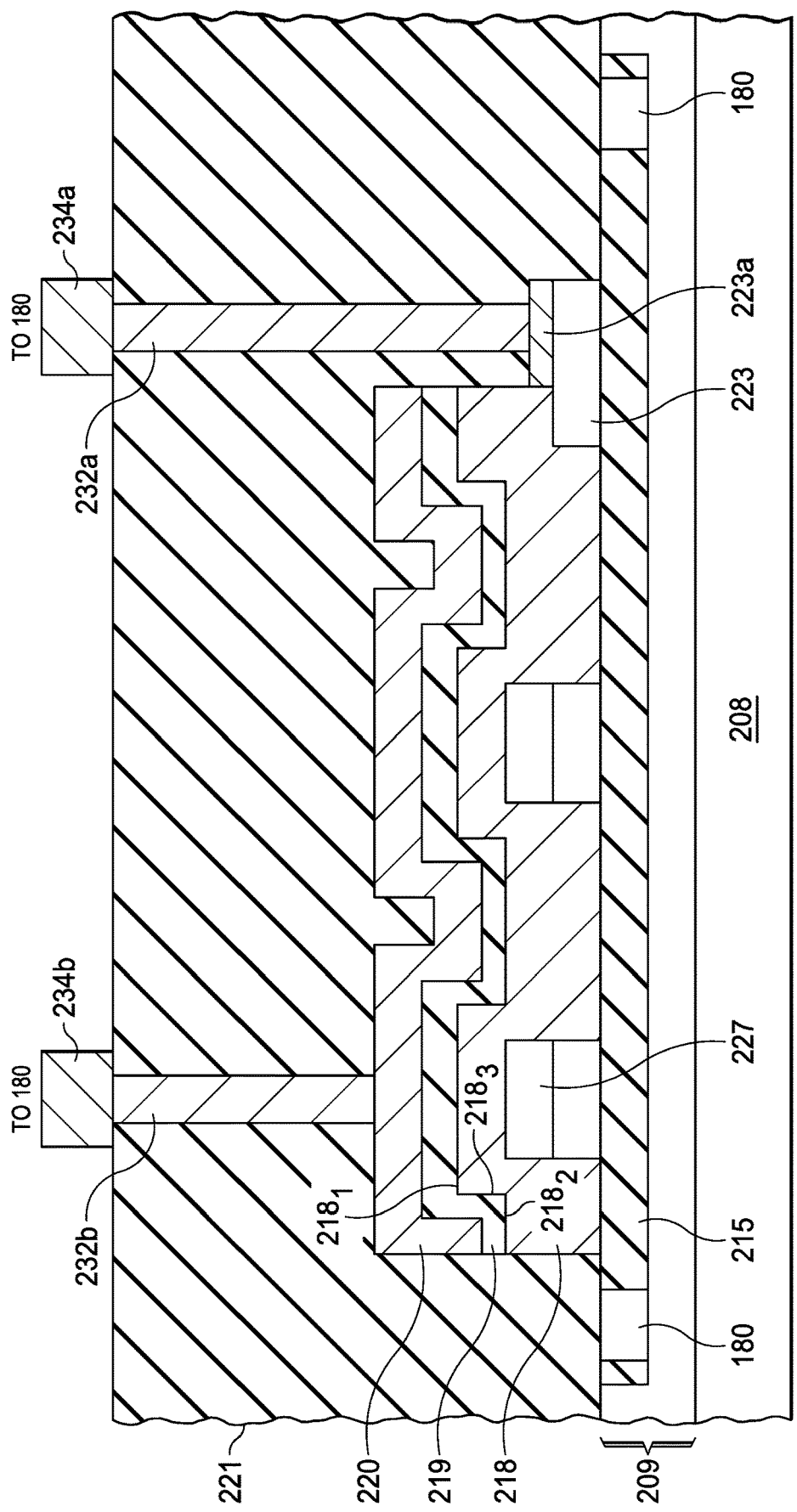

FIG. 6C shows the in-process IC after depositing a bottom capacitor plate layer 218, a capacitor dielectric layer 219, and then a top capacitor plate layer 220. FIG. 6D shows the in-process IC after depositing, patterning and etching a hard mask layer 225 deposited on the top capacitor plate layer 220. FIG. 6D shows the in-process IC after forming a patterned hard mask layer 225 then etching the top capacitor plate 220, the capacitor dielectric layer 219 and bottom capacitor plate layer 218. FIG. 6E shows the in-process IC after optionally removing the hard mask layer 225, siliciding the exposed polysilicon layer 223 to form a silicide layer 223a, depositing a PMD layer 221, then forming and then filling contacts in the PMD layer 221 shown as filled contacts 232a and 232b to contact the bottom capacitor plate layer 218 and the top capacitor plate 220, respectively, and then forming metal contacts 234a, 234b on the PMD layer 221 over the filled contacts 232a and 232b. As shown, the bottom capacitor plate layer 218, capacitor dielectric layer 219 and top capacitor plate 220 each include an upper top surface, a lower top surface, and sidewall surfaces that connect the upper and lower top surfaces. The upper top surface, a lower top surface, and sidewall surfaces of the bottom capacitor plate layer 218 are shown as $218_1$, $218_2$, and $218_3$, respectively.

Disclosed aspects can be extended to include a polysilicon bottom plate that is generally silicided. It is possible to create a 3D MIM capacitor for example by etching trenches through only a portion of the thickness of a polysilicon layer, forming a silicide layer on the polysilicon, followed by a capacitor dielectric layer and top plate deposition, then patterning and etching this layer stack.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. A method of fabricating an integrated circuit (IC) including a Metal-Insulator-Metal (MIM) capacitor, comprising:
    providing a semiconductor surface layer on a substrate;
    forming the MIM capacitor, comprising:
        forming a multilevel bottom capacitor plate over the semiconductor surface layer and having an upper top surface, a lower top surface, and sidewall surfaces that connect the upper and lower top surfaces, wherein the bottom capacitor plate is formed on steps of polysilicon, and the steps of polysilicon are formed by:
            depositing a polysilicon layer; and
            patterning and etching the polysilicon layer;
        depositing a capacitor dielectric layer on the bottom capacitor plate, a surface of the capacitor dielectric layer in direct contact with the bottom capacitor plate;
        forming a top capacitor plate on the capacitor dielectric layer; and
        forming filled contacts through a pre-metal dielectric layer to contact the top capacitor plate and to contact the bottom capacitor plate.

2. The method of claim 1, wherein the capacitor dielectric layer comprises a dielectric stack comprising a first silicon oxide layer, a nitride layer, and a second silicon oxide layer, wherein the depositing the nitride layer comprises low pressure chemical vapor deposition (LPCVD) or plasma enhanced CVD (PECVD), and wherein a hydrogen concentration in the nitride layer is ≤18 atomic %.

3. The method of claim 2, wherein a thickness of the dielectric stack is 200 A to 2,000 A.

4. The method of claim 1, further comprising siliciding a top surface of the polysilicon layer before the patterning and the etching of the polysilicon layer.

5. The method of claim 1, wherein the forming the bottom capacitor plate comprises forming conductive 3D features.

6. The method of claim 5, wherein the forming the bottom capacitor plate comprises siliciding a top surface of the polysilicon layer to form a silicided polysilicon layer, wherein the contact to the bottom capacitor plate is by ones of the filled contacts that contact the silicided polysilicon layer and wherein the conductive 3D features are formed on the silicided polysilicon layer.

7. The method of claim 1, further comprising before the forming the bottom capacitor plate:
    forming and patterning a silicide block (Siblk) layer over the polysilicon layer, and
    patterning and etching the polysilicon layer and then siliciding a top surface of the polysilicon layer, wherein forming the bottom capacitor plate comprises depositing a metal layer over the silicided top surface of the polysilicon layer.

8. The method of claim 1, wherein the bottom capacitor plate comprises TaN, TiN, Ni, Pt, Co, CoSi, or Ir, and wherein the top capacitor plate comprises TaN, TiN, Ni, Pt, Co, CoSi, or Ir.

9. The method of claim 1, wherein the MIM capacitor provides a capacitance/area (C/A) value that is >1.5 fF/$\mu m^2$.

10. The method of claim 1, wherein the semiconductor surface layer under the MIM capacitor structure includes Shallow trench isolation (STI) or LOCal Oxidation of Silicon (LOCOS).

11. An integrated circuit (IC), comprising:
    a semiconductor surface layer of a substrate including functional circuitry comprising circuit elements formed in the semiconductor surface layer configured together with a Metal-Insulator-Metal (MIM) capacitor on the semiconductor surface layer for realizing at least one circuit function;
    the MIM capacitor comprising:
        a multilevel bottom capacitor plate having an upper top surface, a lower top surface, and sidewall surfaces that connect the upper and lower top surfaces, wherein the bottom capacitor plate is on steps including polysilicon;
        a capacitor dielectric layer on the bottom capacitor plate, a surface of the capacitor dielectric layer in direct contact with the bottom capacitor plate;
        a top capacitor plate on the capacitor dielectric layer; and contacts through a pre-metal dielectric layer to contact the top capacitor plate and the bottom capacitor plate.

12. The IC of claim 11, wherein the capacitor dielectric layer comprises a dielectric stack comprising a first silicon oxide layer, a nitride layer, and a second silicon oxide layer, and wherein a hydrogen concentration in the nitride layer is ≤18 atomic %.

13. The IC of claim 12, wherein a thickness of the dielectric stack is 200 A to 2,000 A.

14. The IC of claim 11, wherein the upper top surface of the bottom capacitor plate is on a 3D feature and the lower top surface of the bottom capacitor plate is spaced laterally from the 3D feature.

15. The IC of claim 11, wherein the bottom capacitor plate comprises the bottom capacitor plate itself being a 3D layer.

16. The IC of claim 15, wherein the contact to the bottom capacitor plate is by ones of filled contacts that contact a silicided polysilicon layer.

17. The IC of claim 11, wherein the bottom capacitor plate comprises TaN, TiN, Ni, Pt, Co, CoSi, or Ir, and wherein the top capacitor plate comprises TaN, TiN, Ni, Pt, Co, CoSi, or Ir.

18. The IC of claim 11, wherein the MIM capacitor provides a capacitance/area (C/A) value that is >1.5 fF/$\mu m^2$.

19. An integrated circuit (IC), comprising:
a surface layer of a substrate;
a MIM capacitor on the surface layer, the MIM capacitor comprising:
a multilevel bottom capacitor plate that extends along a first level, from the first level to a second level higher than the first level, and back from the second level to the first level, wherein the bottom capacitor plate is on steps including polysilicon;
a capacitor dielectric layer on the bottom capacitor plate;
a top capacitor plate on the capacitor dielectric layer; and
contacts through a pre-metal dielectric layer to contact the top capacitor plate and the bottom capacitor plate.

20. The IC of claim 19, wherein the bottom capacitor plate at the second level extends over a 3D feature not present where the bottom capacitor plate extends along the first level.

21. The IC of claim 20, wherein the 3D feature comprises polysilicon.

22. The IC of claim 21, wherein the polysilicon of the 3D feature is silicided.

23. The IC of claim 19, wherein the surface layer includes field oxide and a portion of the bottom capacitor plate contacts the field oxide.

24. The IC of claim 19, wherein either the top capacitor plate or the bottom capacitor plate is connected to a pin of the IC.

25. The IC of claim 19, wherein the polysilicon of the steps is first polysilicon, and wherein:
the bottom capacitor plate comprises second polysilicon; and
the top capacitor plate comprises TaN or TiN.

26. The IC of claim 11, wherein the semiconductor surface layer includes field oxide and a portion of the bottom capacitor plate contacts the field oxide.

27. The method of claim 1, wherein forming the top capacitor plate further comprises:
depositing the top capacitor plate on the capacitor dielectric layer;
depositing a hard mask layer; and
etching the hard mask layer, the top capacitor plate, the capacitor dielectric layer, and the bottom capacitor plate using a pattern common to the hard mask layer, the top capacitor plate, the capacitor dielectric layer, and the bottom capacitor plate.

28. The method of claim 10, wherein a portion of the bottom capacitor plate contacts the STI or LOCOS of the semiconductor surface layer.

29. An integrated circuit (IC), comprising:
a surface layer of a substrate, the surface layer including field oxide;
a MIM capacitor on the surface layer, the MIM capacitor including:
a multilevel bottom capacitor plate having an upper top surface, a lower top surface, and sidewall surfaces that connect the upper and lower top surfaces, wherein the multilevel bottom capacitor plate is formed over a 3D feature disposed on the field oxide of the surface layer, a portion of the bottom capacitor plate contacting the field oxide of the surface layer;
a capacitor dielectric layer on the bottom capacitor plate;
a top capacitor plate on the capacitor dielectric layer; and
contacts through a pre-metal dielectric layer to contact the top capacitor plate and the bottom capacitor plate.

30. The IC of claim 29, wherein the field oxide of the surface layer includes a shallow trench isolation (STI) structure or a LOCal Oxidation of Silicon (LOCOS) structure formed in the substrate.

31. The IC of claim 29, wherein the 3D feature including a dielectric material.

32. The IC of claim 29, wherein the 3D feature including an oxide, an oxynitride, or multiple layers thereof.

33. The IC of claim 29, wherein the 3D feature including polysilicon.

34. The IC of claim 33, wherein the polysilicon includes a silicided surface.

35. The IC of claim 29, wherein the capacitor dielectric layer comprises a dielectric stack including a first silicon oxide layer, a nitride layer, and a second silicon oxide layer.

36. The IC of claim 34, wherein a thickness of the dielectric stack is 200 A to 2,000 A.

* * * * *